US009235124B2

(12) United States Patent
Allen et al.

(10) Patent No.: US 9,235,124 B2
(45) Date of Patent: Jan. 12, 2016

(54) PLANARIZATION OVER TOPOGRAPHY WITH MOLECULAR GLASS MATERIALS

(71) Applicant: International Business Machines Corporation, Armonk, NY (US)

(72) Inventors: Robert D. Allen, San Jose, CA (US); Mark W. Hart, San Jose, CA (US); Ratnam Sooriyakumaran, San Jose, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 179 days.

(21) Appl. No.: 13/736,512

(22) Filed: Jan. 8, 2013

(65) Prior Publication Data

US 2013/0125787 A1    May 23, 2013

Related U.S. Application Data

(62) Division of application No. 12/574,171, filed on Oct. 6, 2009, now Pat. No. 8,377,631.

(51) Int. Cl.
  *G03F 7/075* (2006.01)
  *G03F 7/09* (2006.01)
  *C09D 7/12* (2006.01)

(52) U.S. Cl.
  CPC ............ *G03F 7/0752* (2013.01); *C09D 7/1233* (2013.01); *G03F 7/094* (2013.01)

(58) Field of Classification Search
  None
  See application file for complete search history.

(56) References Cited

U.S. PATENT DOCUMENTS

| | | | |
|---|---|---|---|
| 5,886,102 A | 3/1999 | Sinta et al. | |
| 5,939,236 A | 8/1999 | Pavelcheck et al. | |
| 7,198,639 B2 | 4/2007 | Lai et al. | |
| 7,223,517 B2 * | 5/2007 | Babich | G03F 7/091 257/E21.027 |
| 7,399,581 B2 | 7/2008 | Allen et al. | |
| 7,468,330 B2 | 12/2008 | Allen et al. | |
| 7,507,783 B2 * | 3/2009 | Meador | G03F 7/0751 428/447 |
| 2004/0137241 A1 | 7/2004 | Lin et al. | |
| 2006/0068526 A1 | 3/2006 | Takei et al. | |
| 2006/0189779 A1 * | 8/2006 | Allen et al. | 528/40 |

(Continued)

FOREIGN PATENT DOCUMENTS

| | | |
|---|---|---|
| CA | 1204547 | 2/1982 |
| JP | 1293339 | 11/1989 |

(Continued)

OTHER PUBLICATIONS

Lamb, James et al., "Planarizing difficult topographies using contact planarization", Solid State Technology, vol. 46 (10), Oct. 2003, pp. 1-4.

(Continued)

*Primary Examiner* — Sin Lee
(74) *Attorney, Agent, or Firm* — Cantor Colbun LLP

(57) ABSTRACT

Molecular glass based planarizing compositions for lithographic processing are disclosed. The processes generally include casting the planarizing composition onto a surface comprised of lithographic features, the planarizing composition comprising at least one molecular glass and at least one solvent; and heating the planarizing composition to a temperature greater than a glass transition temperature of the at least one molecular glass. Exemplary molecular glasses include polyhedral oligomeric silsesquioxane derivatives, calixarenes, cyclodextrin derivatives, and other non-polymeric large molecules.

7 Claims, 5 Drawing Sheets

(56) References Cited

U.S. PATENT DOCUMENTS

2008/0277724 A1   11/2008  Qi et al.
2009/0197199 A1\*  8/2009  Ishizuka et al. ............ 430/273.1
2010/0183976 A1\*  7/2010  Wang et al. ................ 430/270.1
2014/0186774 A1\*  7/2014  Glodde et al. ................ 430/323

FOREIGN PATENT DOCUMENTS

| | | |
|---|---|---|
| JP | 07166132 A | 6/1995 |
| JP | 11311865 A | 11/1999 |
| JP | 2004212983 A | 7/2004 |
| JP | 2005-216961 | 8/2005 |
| JP | 2005216961 A | 8/2005 |
| JP | 2006251794 A | 9/2006 |
| JP | 2007164045 A | 6/2007 |
| JP | 2009223294 A | 10/2009 |
| JP | 2010020109 A | 1/2010 |
| WO | 2006049046 A1 | 5/2006 |

OTHER PUBLICATIONS

Lin, Michael W., et al. "Simulation and design of planarizing materials for reverse-tone step and flash imprint lithography", J. Micro/Nanolith, MEMS MOEMS vol. 7(2), Apr.-Jun. 2008, pp. 023008-1-023008-19.

Stillwagon, L.E., "Planarization of Substrate Topography by Spin-Coated Films: A Review", Solid State Technology, Jun. 1987, pp. 67-71.

Takei et al; ("Gap Fill Materials Using Cyclodextrin Derivatives in ArF Lithography", Japanese Journal of Applied Physics, vol. 46, No. 11, p. 7273-7278 (2007)).

\* cited by examiner

Molecular Glass Based Planarizing Composition

Polymer Based Planarizing Composition

Molecular Glass Based
Planarizing Composition

Polymer Based
Planarizing Composition

PLANARIZATION OVER TOPOGRAPHY WITH MOLECULAR GLASS MATERIALS

CROSS REFERENCE TO RELATED APPLICATIONS

This application is a DIVISIONAL application of and claims priority to U.S. application Ser. No. 12/574,171, filed on Oct. 6, 2009, incorporated herein by reference in its entirety.

BACKGROUND

The present invention generally relates to planarization compositions for lithographic processes, and in particular, to lithographic processes using non-polymeric amorphous materials as a planarizing layer.

Progress in nanotechnology depends on advances in lithography and post-lithographic processing techniques. One such technique, known as reverse-tone processing (RTP), can be used to create unique nanostructures and extend the utility and process latitude of established lithographic techniques. This particular application can benefit from improvement with respect to planarization layers.

As shown in FIG. 1, the RTP process 10 generally includes casting a topcoat film 12, typically by spin-coating, onto a surface 14 comprised of lithographic features 16, i.e., having various topographic features. The topcoat can form a planarizing film 12' or non-planar film 12 depending on the material properties and deposition. Ideally, the deposited topcoat film completely fills all the gaps 18 between those features and forms a planar surface 20 as shown in the right figure (labeled Planar Film) regardless of the topography provided by the underlying lithographic features. In addition, the composition of the topcoat film should be selected to provide high plasma etch selectivity relative to the underlying lithographic features.

After the topcoat film is cast, a plasma etch process is used to remove a portion of the topcoat film and is stopped when the top surface of the underlying lithographic features 16 are exposed. The plasma chemistry is then changed to one that selectively etches the lithographic features (and any associated under layer) with respect to the planarizing film. After this step, the tone of the features on the substrate has been reversed and is opposite to those that were lithographically formed. Depending on the application, the reverse tone features can possess greater height-to-width aspect ratios than the original lithographically formed features.

The many technical and economic advantages of using spin-coating to cast films are known to those skilled in the art. During spin-coat for RTP, however, surface forces and fluid dynamical effects coupled with the underlying topography 16 can result in a more conformal-like coating leading to a non-planar topcoat. Subsequent etching of this non-planar film can result in poor pattern transfer as shown.

It has been found that the degree of planarization over topography such as that used in RTP depends on the aspect ratio and lateral density of the topography and on the thickness of the planarizing film. In general, tall and narrow features are more difficult to planarize, and the degree of planarization decreases as the distance between topographic features increases and as the film thickness approaches the height of the topography (Stillwagon et. al., Solid State Technol. 30(6), 67-71 (1987)). This implies that it will be difficult to planarize the space between isolated lines, especially when a thin planarizing layer is desired.

Various techniques have been attempted to provide planar coatings. For example, planarization via thermal reflow of polymeric materials has been reported (Stillwagon et. al., Solid State Technol. 30(6), 67-71 (1987)). In this technique, a polymer resin is cast in a volatile solvent and applied via spin coating. The resulting polymer film is heated above its glass transition temperature (Tg) to reduce the viscosity of the film so that surface forces will induce lateral flow and promote planarization. Unfortunately, the viscosity of polymer films do not drop significantly when heating at Tg and acceptable levels of planarization typically require high bake temperatures and/or long bake times.

A variety of other planarization approaches have also been developed. These include etch-back planarization, chemical mechanical planarization, imprint planarization (Lamb et. al., Solid State Technol. 46(10), 53-56 (2003)), and spin coating of photopolymerizable non-volatile monomers (Lin. et. al., J. Micro/Nanolith, MEMS MOEMS 7(2), 023008 (April-June 2008). Unfortunately, these approaches require special tooling and/or additional steps beyond the simple, mature, and ubiquitous spin-coating and heating techniques.

In view of the foregoing, there is a need in the art for planarization materials and methods that can be applied over topography that overcome the limitations of thermal reflow polymers and the complications and/or expense of additional tooling and/or processing steps.

SUMMARY

According to one embodiment of the present invention, a lithographic process comprises casting a planarizing composition onto a surface comprised of lithographic features, the planarizing composition comprising at least one molecular glass and at least one solvent; and heating the planarizing composition to a temperature greater than a glass transition temperature of the at least one molecular glass.

In another embodiment, a process of reversing tone of a patterned layer comprised of topographical features, comprises casting a planarizing composition onto the patterned layer, the planarizing composition comprising at least one molecular glass and at least one solvent; post apply baking the planarizing composition at a temperature greater than a glass transition temperature of the molecular glass; selectively etching a portion of the planarizing composition to expose a top surface of the topographical features defined by the patterned layer surface; and selectively etching the exposed patterned layer with respect to the planarizing composition.

In other embodiments, planarizing compositions that include a polyhedral oligomeric silsesquioxane are disclosed.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter, which is regarded as the invention, is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
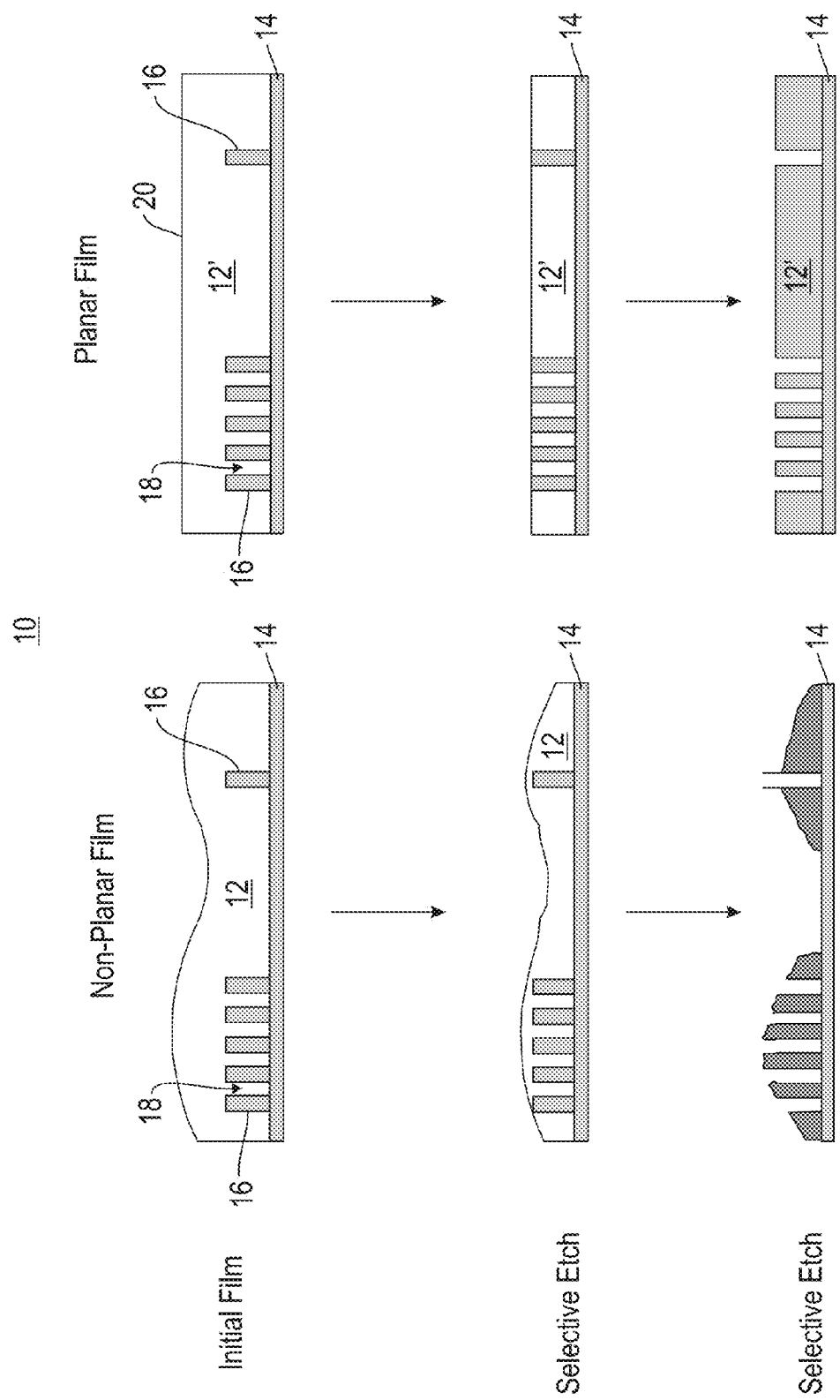
FIG. 1 schematically illustrates the effect planarity has on a topcoat on pattern transfer.

The present invention relates to planarizing compositions and processes over topography. For ease of understanding, reference will be made to reverse tone processes such as those described above. However, it should be noted that the present invention is not intended to be limited to RTP and has potential utility in other applications that benefit from planarization layers. In optical lithography, for example, this invention could be used to planarize underlying topography to mitigate depth-of-focus limitations and improve image quality. In another example, this invention could be used to reduce the surface roughness of substrates and therefore reduce the cost associated with traditional polishing. In addition, this invention permits tuning the composition of the planarization material to suit the application. In RTP a silicon-containing composition may be preferred, while in optical lithography or substrate-smoothing this may not be the case.

The planarizing composition includes at least one molecular glass, i.e., an amorphous non-polymeric macromolecule. When planarizing compositions are spin coated onto a substrate that includes topography in the form of lithographic features and heated above the glass transition temperature (Tg), the molecular glasses advantageously flow over the topography to completely fill all the gaps, do not negatively interact with the underlying lithographic features, and form a substantially planar surface. Because the molecular glasses are non-polymeric macromolecules, the viscosity above the Tg is generally much lower than that of prior art polymer materials having comparable Tgs, and as such, provide a higher degree of planarization. Moreover, the molecular glasses can be configured to provide high etch selectivity relative to the lithographic features that define the surface topography.

The molecular glasses are selected to have a relatively low glass transition temperature and high etch selectivity relative to the underlying lithographic features the molecular glasses are initially intended to cover. Examples of suitable molecular glasses include, without limitation, polyhedral oligomeric silsesquioxane (PSS) derivatives, cyclodextrin derivatives, calixarene derivatives, and other large non-polymeric functional molecules. In one embodiment, the glass transition temperature of the particular molecular glass is within a range of about 200° C. to about 20° C. In other embodiments, the glass transition temperature of the particular molecular glass is about 150° C. to 20° C., and in still other embodiments, less than 100° C. to 20° C. For ease of understanding, specific reference will now be made to the PSS derivatives as being a representative molecular glass. However, it should be appreciated by those skilled in the art that that the other large non-polymeric functional molecules, such as the calixarenes and cyclodextrin derivatives, can be used in a similar manner.

PSS derivatives are well suited for RTP because they generally have glass transition temperatures less than 100° C. Because PSS derivatives possess high silicon content, it is expected that etch selectivity will be high relative to the underlying lithographic features. As such, a post apply bake temperature of 100° C., which is commonly used in processing photoresists, would be sufficient to effect planarization once the PSS derivative is cast.

Exemplary PSS derivatives are of the general structure as provided in formulas (I)-(VI):

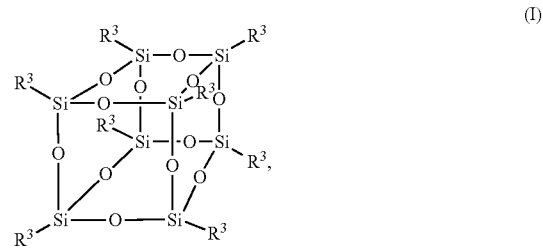

(I)

wherein formula (I) is denoted by the formula $T_8^{R3}$, where T represents $R^3SiO_{3/2}$;

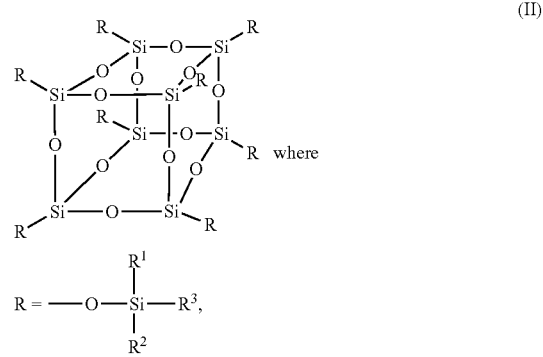

(II)

wherein formula (II) is denoted by the formula $Q_8M_8^{R1,R2,R3}$ where Q represents $SiO_{4/2}$ and $M^{R1,R2,R3}$ represents $R^1$, $R^2$, $R^3SiO_{1/2}$;

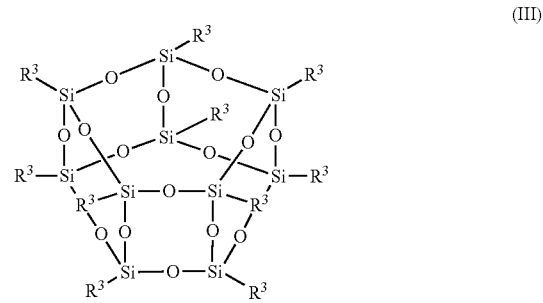

(III)

wherein formula (III) is denoted by the formula $T_{10}^{R3}$, where T represents $R^3SiO_{3/2}$;

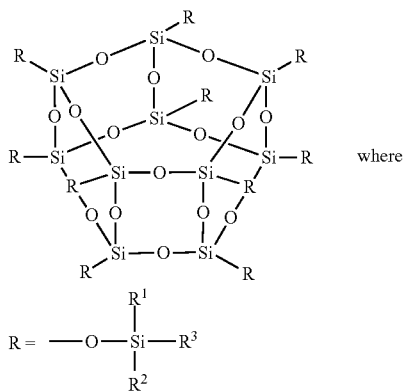

wherein formula (IV) is denoted by the formula $Q_{10}M_{10}^{R1,R2,R3}$ where Q represents $SiO_{4/2}$ and $M^{R1,R2,R3}$ represents $R^1, R^2, R^3SiO_{1/2}$;

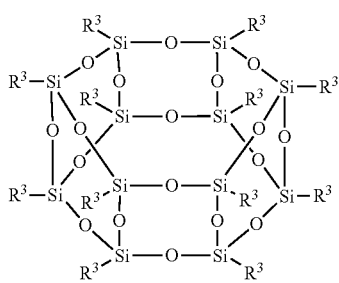

wherein formula (V) is denoted by the formula $T_{12}^{R3}$, where T represents $R^3SiO_{3/2}$;

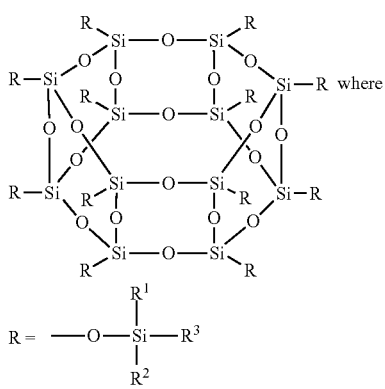

wherein formula (VI) is denoted by the formula $Q_{12}M_{12}^{R1,R2,R3}$ where Q represents $SiO_{4/2}$ and $M^{R1,R2,R3}$ represents $R^1, R^2, R^3SiO_{1/2}$;

wherein $R^1$ and $R^2$ are independently selected from the group consisting of hydrogen, a linear alkyl group having 1-6 carbon atoms, a branched alkyl group having 2-12 carbon atoms, a cycloalkyl group having 3-17 carbon atoms, a fluorinated linear alkyl group having 2-12 carbon atoms, a fluorinated branched alkyl group having 2-12 carbon atoms, a fluorinated cycloalkyl group having 3-17 carbon atoms, a cycloalkyl substituted alkyl group having 4-23 carbon atoms and an alkyl substituted cycloalkyl group having 4-23 carbon atoms; and wherein $R^3$ is selected from the group consisting of a linear alkyl group having 1-6 carbon atoms, a branched alkyl group having 2-12 carbon atoms, a cycloalkyl group having 3-17 carbon atoms, a fluorinated linear alkyl group having 2-12 carbon atoms, a fluorinated branched alkyl group having 2-12 carbon atoms, a fluorinated cycloalkyl group having 3-17 carbon atoms, a cycloalkyl substituted alkyl group having 4-23 carbon atoms and an alkyl substituted cycloalkyl group having 4-23 carbon atoms, a cycloaliphatic alcohol, a cycloaliphatic acid, a cycloaliphatic ester, a phenol, an aliphatic alcohol, an aliphatic acid, an aliphatic ester, a fluorocarbon alcohol, an amine, an amide, a vinyl ether, and an epoxide.

In the notation $SiO_{x/y}$, x represents the number of oxygen atoms to which each silicon atom is bonded and y represents the number of silicon atoms to which each oxygen is bonded. The PSS resins of the present invention may be denoted by the general formulas $T_m^{R3}$ where m is equal to 8, 10 or 12 and $Q_nM_n^{R1,R2,R3}$ where n is equal to 8, 10 or 12.

It should also be noted that the notation $Q_nM_n^{R1,R2,R3}$ may be written as $Q_nM_n^{R2,R3}$ when $R^1$ is —$CH_3$, as $Q_nM_n^{R1,R2,R3}$ when $R^2$ is —$CH_3$, as $Q_nM_n^{R3}$ when both $R^1$ and $R^2$ are —$CH_3$, as $Q_nM_n^{H,R2,R3}$ when $R^1$ is —H, as $Q_nM_n^{R1,H,R3}$ when R is —H, as $Q_nM_n^{H,H,R3}$ when both $R^1$ and $R^2$ are —H and as $Q_nM_n^{H,R3}$ when $R^1$ is —$CH_3$ and $R^2$ is H.

In one embodiment, the polyhedral oligomeric silsesquioxane derivative is selected from the group consisting of formulas (II), (IV), (VI) wherein at least one of the R groups of each formula is selected from the groups consisting of formulas (XIII) and (XIV).

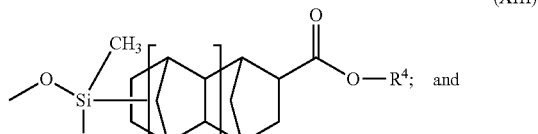

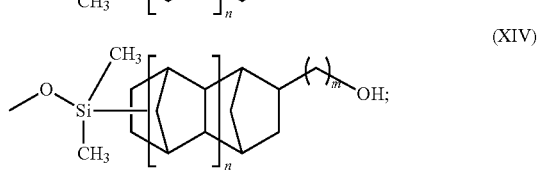

wherein n=0 or 1, m=0, 1, or 2, and R is a C1-C3 alkyl group.

By way of example, the following PSS derivatives of formula (II) were synthesized and the glass transition temperature measured. The results are shown in Table 1 below. As detailed below, the glass transition temperature is well below the post apply bake temperatures commonly used to process photoresists. Thus, the same coating equipment used to cast photoresists can be used to cast the planarizing compositions.

TABLE 1

| Structure | R | Tg (° C.) |
|---|---|---|
| (II)A | ![structure] | 35 |

TABLE 1-continued

| Structure | R | Tg (° C.) |
|---|---|---|
| (II)B | 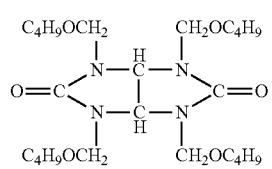 | 37 |
| (II)C | 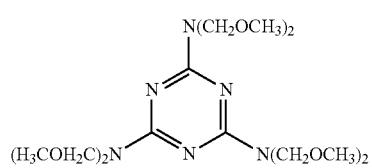 | 38 |

In one embodiment, the planarizing composition includes at least one molecular glass and at least one solvent.

In another embodiment, the planarizing composition includes at least one molecular glass that includes reactive moieties, a crosslinking component, an optional acid generator, and at least one solvent.

The crosslinking component is preferably a crosslinker that can be reacted with the molecular glass in a manner that is catalyzed by generated acid and/or by heating. Generally, the crosslinking component used in the planarizing compositions of the invention may be any suitable crosslinking agent known in the negative photoresist art which is otherwise compatible with the other selected components of the composition. The crosslinking agents preferably act to crosslink the molecular glass component in the presence of a generated acid or heat. Preferred crosslinking agents are glycoluril compounds such as tetramethoxymethyl glycoluril, methylpropyltetramethoxymethyl glycoluril, and methylphenyltetramethoxymethyl glycoluril, available under the POWDERLINK trademark from Cytec Industries. Other possible crosslinking agents include: 2,6-bis(hydroxymethyl)-p-cresol, and compounds having the following structures (VII)-(XII) including their analogs and derivatives, such as those found in Japanese Laid-Open Patent Application (Kokai) No. 1-293339, as well as etherified amino resins, for example methylated or butylated melamine resins (N-methoxymethyl- or N-butoxymethyl-melamine respectively) or methylated/butylated glycolurils, for example as can be found in Canadian Patent No. 1 204 547.

(VII)

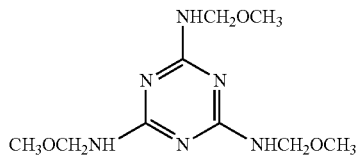

(VIII)

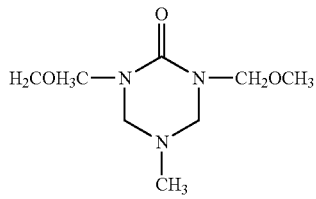

(IX)

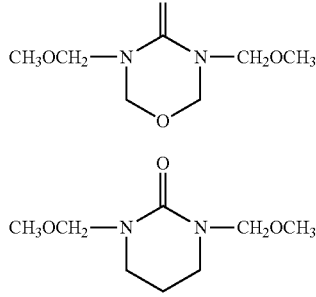

(X)

$$\text{H}_2\text{COH}_3\text{C}-\text{N}\underset{\underset{\text{CH}_3}{|}}{\overset{\overset{\text{O}}{||}}{\text{N}}}-\text{CH}_2\text{OCH}_3$$

(XI)

$$\text{CH}_3\text{OCH}_2-\text{N}\overset{\overset{\text{O}}{||}}{\text{N}}-\text{CH}_2\text{OCH}_3$$

(XII)

$$\text{CH}_3\text{OCH}_2-\text{N}\overset{\overset{\text{O}}{||}}{\text{N}}-\text{CH}_2\text{OCH}_3$$

Other crosslinking agents such as bis-epoxies or bis-phenols (e.g., bisphenol-A) may also be used. Combinations of crosslinking agents may be used.

In one embodiment, the optional acid generator is a compound that liberates acid upon thermal treatment. A variety of known thermal acid generators are suitably employed such as for example, 2,4,4,6-tetrabromocyclohexadienone, benzoin tosylate, 2-nitrobenzyl tosylate and other alkyl esters of organic sulfonic acids. Compounds that generate a sulfonic acid upon activation are generally suitable. Other suitable thermally activated acid generators are described in U.S. Pat. Nos. 5,886,102 and 5,939,236; the disclosures of these two patents are incorporated herein by reference. If desired, a radiation-sensitive acid generator may be employed as an alternative to the thermally activated acid generator or in combination with the thermally activated acid generator. Examples of suitable radiation-sensitive acid generators are described in U.S. Pat. Nos. 5,886,102 and 5,939,236. Other radiation-sensitive acid generators known in the resist art may also be used as long as they are compatible with the other components of the antireflective composition. Where a radiation-sensitive acid generator is used, the cure (crosslinking) temperature of the composition may be reduced by application of appropriate radiation to induce acid generation which in turn catalyzes the crosslinking reaction. Even if a radiation-sensitive acid generator is used, it is preferred to thermally treat the composition to accelerate the crosslinking process (e.g., for wafers in a production line).

The choice of solvent is governed by many factors not limited to the solubility of the molecular glass, the coating process, and safety and environmental regulations. Additionally, inertness to the underlying lithographic features is desirable. It is also desirable that the solvent possess the appropriate volatility to allow uniform coating of films yet also allow significant reduction or complete removal of residual solvent during the post-application bake process. Solvents may generally be chosen from ether-, ester-, hydroxyl-, and ketonecontaining compounds, or mixtures of these compounds. Examples of appropriate solvents include cyclopentanone, cyclohexanone, lactate esters such as ethyl lactate, alkylene glycol alkyl ether esters such as propylene glycol methyl ether acetate, alkylene glycol monoalkyl esters such as methyl cellosolve, butyl acetate, 2-ethoxyethanol, and ethyl 3-ethoxypropionate, and hydrocarbon alcohols such as 1-butanol, 2,3-dimethyl-2-butanol, 1-pentanol, 4-methyl-2-pentanol, 2-ethyl hexanol, ethylene glycol, 1,2-butanediol, 1,3-butanediol, 1,4-butanediol, 1,2-propanediol, 1,3-propanediol, and other hydrocarbon alcohols having 4 to 8 carbons. Preferred solvents include ethyl lactate, propylene glycol methyl ether acetate, and mixtures of ethyl lactate and ethyl 3-ethoxyproprionate. The above list of solvents is for illustrative purposes only and should not be viewed as being comprehensive nor should the choice of solvent be viewed as limiting the invention in any way. Those skilled in the art will recognize that any number of solvents or solvent mixtures may be used.

The planarizing compositions of the invention preferably contain (on a solids basis) about 50-100 wt. % of the molecular glass, and in other embodiments, about 70-80 wt. %. In those embodiments where the molecular glass includes reactive moieties, the planarizing composition, in addition to the molecular glass as defined above, includes about 1-50 wt. % of crosslinking component, more preferably about 3-25%, most preferably about 5-25 wt. %, and about 1-20 wt. % acid generator, more preferably about 1-15 wt. %.

The planarizing compositions of this invention may be formed into planarizing layer on a substrate by spin-coating followed by a post apply baking (PAB) step to achieve planarization. The PAB is preferably conducted at 90° C. to 200° C., more preferably 90° C. to 150° C. The PAB is for a period of time to effect planarization of the coating. In one embodiment, the post apply bake time is less than 2 minutes. In other embodiments, the post apply bake time is for 30 seconds to 90 seconds and in still other embodiments, from 45 seconds to 60 seconds.

For additional information concerning terms used in the field of lithography and lithographic compositions, reference may be had to Introduction to Microlithography, Eds. Thompson et al. (Washington, D.C.: American Chemical Society, 1994).

It is to be understood that while the invention has been described in conjunction with the preferred specific embodiments thereof, that the foregoing description as well as the examples that follow are intended to illustrate and not limit the scope of the invention. Other aspects, advantages and modifications within the scope of the invention will be apparent to those skilled in the art to which the invention pertains.

The following examples are intended to provide those of ordinary skill in the art with a complete disclosure and description of how to prepare and use the compositions disclosed and claimed herein. Efforts have been made to ensure accuracy with respect to numbers (e.g., amounts, temperature, etc.), but allowance should be made for the possibility of errors and deviations. Unless indicated otherwise, parts are parts by weight, temperature is in ° C. and pressure is at or near atmospheric. Additionally, all starting materials were obtained commercially or were synthesized using known procedures.

Where appropriate, the following techniques and equipment were utilized in the Examples: $^1$H and $^{13}$C NMR spectra were obtained at room temperature on an Avance 400 spectrometer. Quantitative $^{13}$C NMR was run at room temperature in acetone-$d_6$ in an inverse-gated $^1$H-decoupled mode using Cr(acac)$_3$ as a relaxation agent on an Avance 400 spectrometer. Thermo-gravimetric analysis (TGA) was performed at a heating rate of 5° C./min in N$_2$ on a TA Instrument Hi-Res TGA 2950 Thermogravimetric Analyzer. Differential scanning calorimetry (DSC) was performed at a heating rate of 10° C./min on a TA Instruments DSC 2920 modulated differential scanning calorimeter. Molecular weights were measured in tetrahydrofuran (THF) on a Waters Model 150 chromatograph relative to polystyrene standards. IR spectra were recorded on a Nicolet 510 FT-IR spectrometer on a film cast on a KBr plate. Film thickness was measured on a Tencor Alpha-step 2000 or a NanoMetrics Nanospec 6100.

Rheology measurements were performed on an AR 2000 TA Instruments rheometer with a 40 millimeter (mm), 2 degree cone and plate geometry. The measurements were carried out with 5% strain in oscillatory mode, and the temperature was kept constant at 90° C. with a peltier plate. The data were fit with the Carreau model, and the zero shear viscosity was determined from this fit. The Carreau model is given as follows:

$$\eta = [\eta_0 + (\lambda \dot{\gamma})]^{n-1}$$

where $\eta$ is viscosity, $\eta_0$ is the zero shear or Newtonian viscosity, $\dot{\gamma}$ is the shear rate, $\lambda$ is a constant with time units, and n is the power-law index.

EXAMPLE 1

In this example, the synthesis of octa(hydroxynorbornyl) octasilane PSS (structure (II)A) is described. Octakis(dimethylsilyloxy)silsesquioxane ($Q_8M_8^H$) (2.54 grams (g), 0.0025 mole), 5-norbornen-2-ol, mixture of endo and exo, (2.25 g, 0.0205 mole), and tetrahydrofuran (THF) (20 ml) were placed in a round bottom flask equipped with a magnetic stirrer, nitrogen inlet, and a water condenser. Platinum (0)-1, 3-divinyl-1,1,3,3-tetramethyldisiloxane complex in xylene (1 milliliter (ml)) was added to this mixture and stirred at room temperature for two hours. The reaction was complete at this time as determined by the IR spectrum of a thin film of the mixture on a sodium chloride plate. This solution was added dropwise into 400 ml hexanes. The product coagulated and was separated by decantation. It was rinsed twice with 100 ml hexanes and dried under vacuum at 60° C. for 18 hours to give 3.29 grams of a brown solid. The GPC of the material showed a major peak with Mw=1579 and PDI=1.02. In addition, there is a small fraction (16%) with Mw=3678 and PDI=1.07 which is described in the literature as a dimer of the desired product. Tg=35° C.

EXAMPLE 2

In this example, the synthesis of poly(trimethylsilylmethyl methacrylate), which is a low Tg polymer used for comparative purposes, is described. Trimethylsilylmethyl methacrylate (TMSMMA) (15.0 g, 0.087 mole) and 45 grams of tetrahydrofuran were placed in a round bottom flask equipped with a condenser and a nitrogen inlet. 2,2'-Azobisisobutyronitrile (AIBN) (0.57 g, 0.0035 mole) and 1-dodecanethiol (0.52 g, 0.0026 mole) were added to this solution and stirred until dissolved. Then, the solution was degassed using four vacuum/nitrogen purges. The contents were then heated to reflux for 18 hours. Afterwards, the solution was added dropwise into a mixture of methanol and water (10:3) (1.3 liter). The polymer coagulated and it was separated by decantation. It was then dried under vacuum at 70° C. for 18 hours to give 12.72 grams of the polymer. Mw=5,826, PDI=1.68, Tg=40° C.

EXAMPLE 3

In this example, formulation of a planarizing composition containing octa(hydroxynorbornyl)octasilane PSS (Structure (II)A) is described. 2 grams of octa(hydroxynorbornyl)octasilane PSS was dissolved in 23 grams of 4-methyl-2-pentanol to give an 8 wt % solution. This solution was filtered through a 0.2 micrometer syringe filter.

EXAMPLE 4

In this example, formulation of a polymeric composition containing poly(trimethylsilylmethyl methacrylate) is described. 2 grams of poly(trimethylsilylmethyl methacrylate) was dissolved in 26.6 grams of 4-methyl-2-pentanol to give a 7 wt % solution. This solution was filtered through a 0.2 micrometer syringe filter.

EXAMPLE 5

In this example, a crosslinkable planarizing composition containing octa(hydroxynorbornyl)octasilane PSS (Structure (II)A) is described. 0.50 grams of octa(hydroxynorbornyl)octasilane PS, 50 milligrams (mg) of powderlink 1174 (tetrakis(methoxymethyl)glycoluril from Cytec Industries), and 25 mg of trifluoromethylsulfonyloxy phthalimide (N-PIT) were dissolved in 6.6 grams of 4-methyl-2-pentanol and filtered through a 0.20 micrometer syringe filter.

EXAMPLE 6

Figure 2:
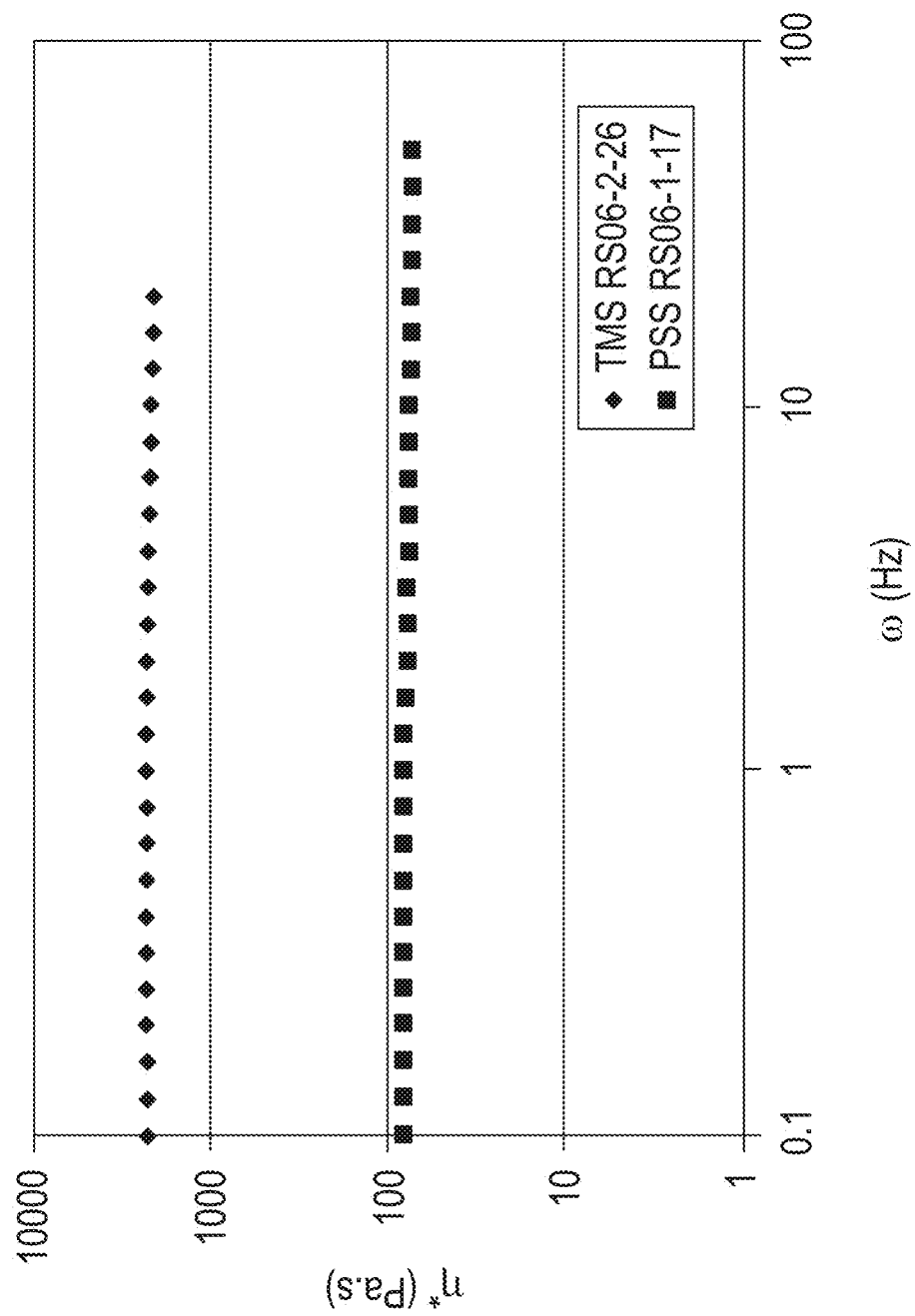
FIG. 2 graphically illustrates the zero shear viscosity from the Carreau model for a planarizing composition containing a molecular glass compared to a polymeric composition.

In this example, viscosities of the polymer [poly(trimethylsilylmethyl methacrylate)] and the PSS derivative [octa(hydroxynorbornyl)octasilane PSS (Structure (II)A)] were measured at 90° C. The results are shown in FIG. 2. Even though the polymer and the PSS derivative have relatively low glass transition temperatures of 35° C. and 40° C., respectively, the viscosity of the PSS derivative is much lower (78 Pa·s) compared to that of the polymer (2235 Pa·s) at 90° C.

EXAMPLE 7

Figure 3A:
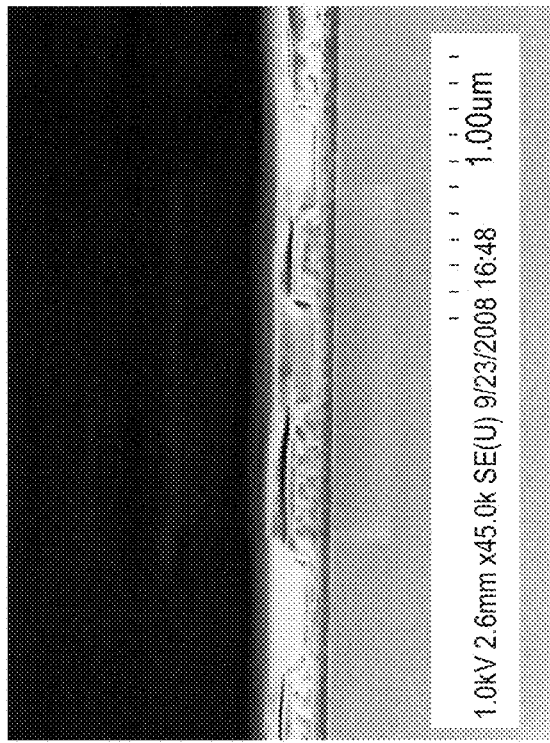
FIG. 3A-3D pictorially illustrates scanning electron micrographs of cross sectional views of a topcoat disposed over topographical features produced by step-and-flash imprint lithography. A topcoat formed of molecular glass based planarizing composition according to the present invention is compared to a topcoat formed of a polymer composition.
Figure 3B:
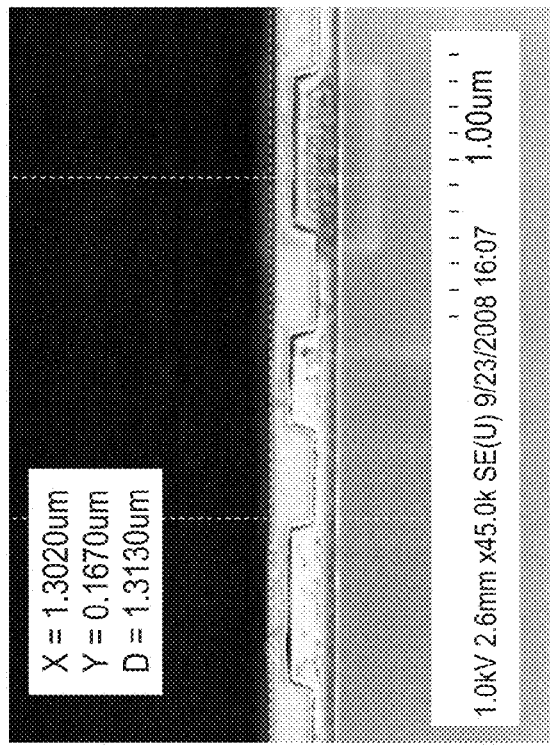
Figure 3C:
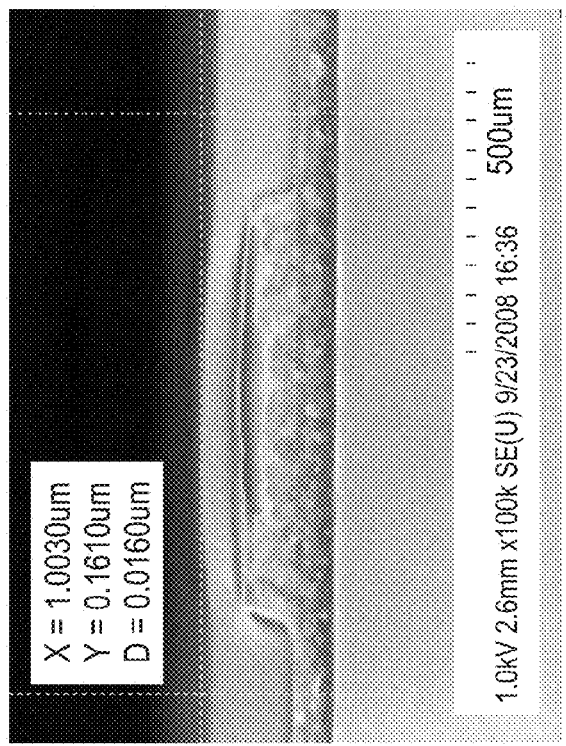
Figure 3D:
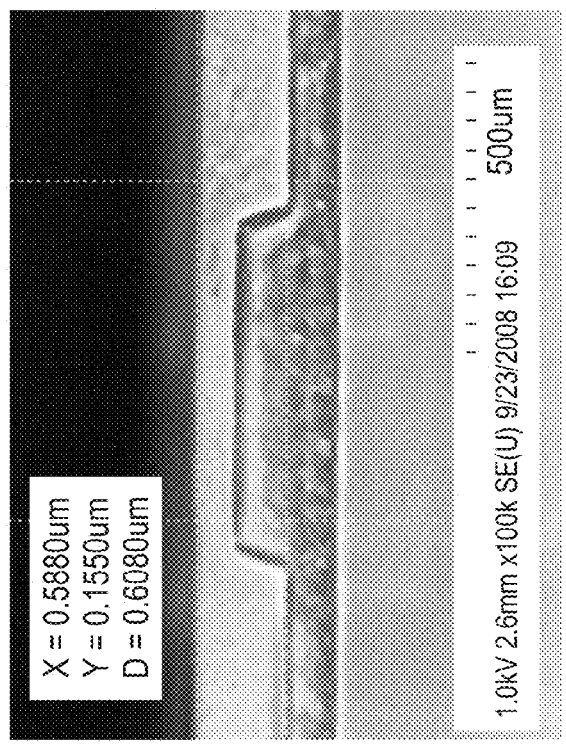

In this example, an 8% solution of octa(hydroxynorbornyl)octasilane PSS (Structure (II)A) in 4-methyl-2-pentanol (Example 3) was spin coated at 3000 rpm over a silicon substrate with a topographically patterned film and baked at 100° C. for 90 seconds to give an overcoat approximately 140 nm thick. The topographic features were formed by step-and-flash imprint lithography performed by Molecular Imprints, Incorporated (Austin, Tex.) and were approximately 100 nm tall and resided on an imprint-formed base layer with a thickness of approximately 100 nm. Similarly, a 7% solution of poly(trimethylsilylmethyl methacrylate) (Example 4) was cast over a nominally identical topographically patterned film and processed in a nominally identical fashion to give an overcoat approximately 140 nm thick. The cross sections (SEM images) are shown in FIG. 3. Specifically, FIGS. 3A and 3C provide cross sectional views of the molecular glass based planarizing composition whereas FIGS. 3B and 3D provide cross sectional views of the polymer based planarizing composition. Even though the derivative and the polymer have low Tgs, the derivative planarizes the images better than the polymer. This probably is due to much lower viscosity for the derivative above its glass transition temperature.

EXAMPLE 8

Figure 4:
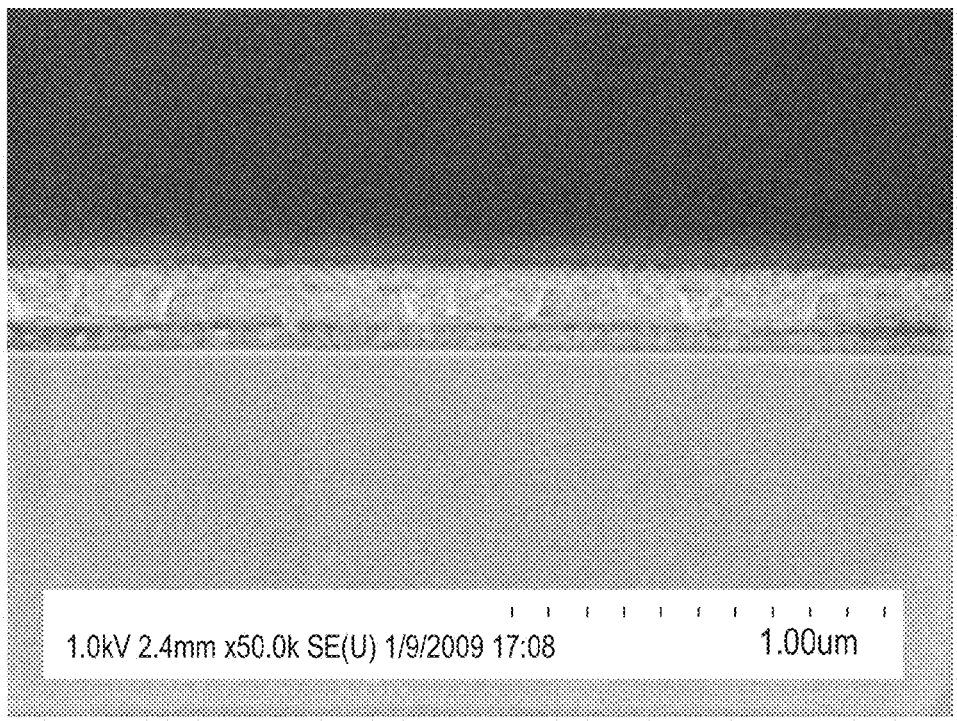
FIG. 4 pictorially illustrates a scanning electron micrograph of a cross sectional view of a topcoat disposed over topographical features produced by step-and-flash imprint lithography, wherein the planarizing composition includes a crosslinked molecular glass.

In this example, the composition of Example 5 was spin coated at 3000 rpm over a silicon substrate with a topographically patterned film and baked at 120° C. for 90 seconds to give an overcoat approximately 140 nm thick. The overcoat was planar and did not dissolve in acetone, thus indicating cross-linking. octa(hydroxynorbornyl)octasilane PSS readily dissolves in acetone. A cross-sectional SEM image is presented in FIG. 4.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, and equivalents of all means or step plus function elements in the claims below are intended to include any structure, material, or for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. A planarizing composition to be applied over underlying topography, comprising:
   a crosslinking component catalyzed by generated acid or applied heat;
   a thermal acid generator; and
   a polyhedral oligomeric silsesquioxane selected from the group consisting of formulas (II), (IV) and (VI):

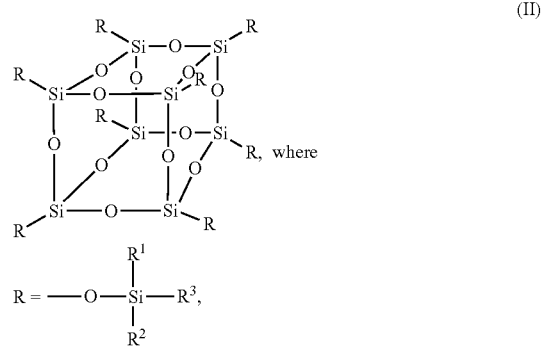

wherein formula (II) is denoted by the formula $Q_8M_8^{R1,R2,R3}$ where Q represents $SiO_{4/2}$ and $M^{R1,R2,R3}$ represents $R^1$, $R^2$, $R^3SiO_{1/2}$;

(IV)

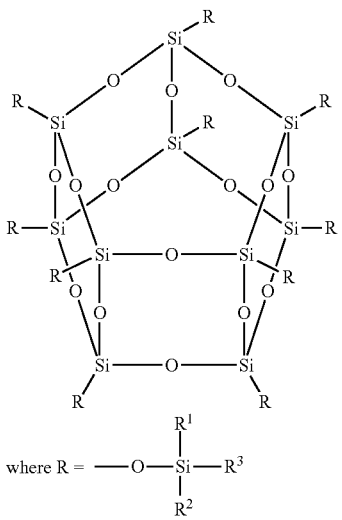

wherein formula (IV) is denoted by the formula $Q_{10}M_{10}^{R1,R2,R3}$ where Q represents $SiO_{4/2}$ and $M^{R1,R2,R3}$ represents $R^1, R^2, R^3SiO_{1/2}$; and (VI)

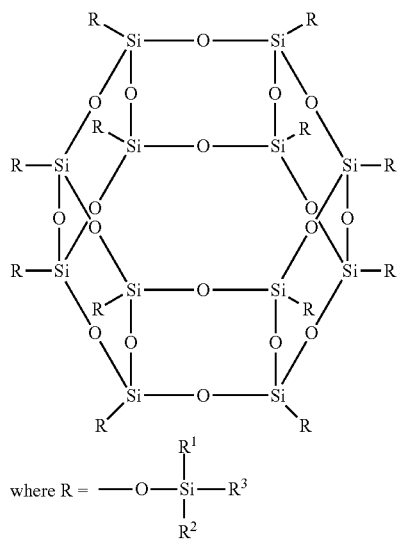

wherein formula (VI) is denoted by the formula $Q_{12}M_{12}^{R1,R2,R3}$ where Q represents $SiO_{4/2}$ and $M^{R1,R2,R3}$ represents $R^1, R^2, R^3SiO_{1/2}$;
wherein $R^1$ and $R^2$ are independently selected from the group consisting of hydrogen, a linear alkyl group having 1-6 carbon atoms, a branched alkyl group having 2-12 carbon atoms, a cycloalkyl group having 3-17 carbon atoms, a fluorinated linear alkyl group having 2-12 carbon atoms, a fluorinated branched alkyl group having 2-12 carbon atoms, a fluorinated cycloalkyl group having 3-17 carbon atoms, a cycloalkyl substituted alkyl group having 4-23 carbon atoms and an alkyl substituted cycloalkyl group having 4-23 carbon atoms;
wherein $R^3$ is selected from the group consisting of a linear alkyl group having 1-6 carbon atoms, a branched alkyl group having 2-12 carbon atoms, a cycloalkyl group having 3-17 carbon atoms, a fluorinated linear alkyl group having 2-12 carbon atoms, a fluorinated branched alkyl group having 2-12 carbon atoms, a fluorinated cycloalkyl group having 3-17 carbon atoms, a cycloalkyl substituted alkyl group having 4-23 carbon atoms and an alkyl substituted cycloalkyl group having 4-23 carbon atoms, a cycloaliphatic alcohol, a cycloaliphatic acid, a cycloaliphatic ester, a phenol, an aliphatic alcohol, an aliphatic acid, an aliphatic ester, a fluorocarbon alcohol, an amine, an amide, a vinyl ether, and an epoxide; and at least one solvent, wherein at least one of the R groups in formulae (II), (IV) and (VI) is defined by formula (XIV):

(XIV)

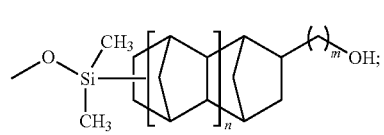

wherein n=0 or 1, and m=0, 1, or 2.

2. The planarizing composition of claim 1, wherein the crosslinking component is selected from the group consisting of epoxy derivatives and glycoluril derivatives.

3. The planarizing composition of claim 1, wherein the thermal acid generator is selected from the group consisting of trifluoromethylsulfonyloxy phthalide, 2,4,4,6-tetrabromocyclohexadienone, benzoin tosylate, 2-nitrobenzyl tosylate, and ammonium triflate.

4. The planarizing composition of claim 1, comprising a solvent selected from the group consisting of propylene glycol monomethyl ether acetate, ethyl lactate, cyclohexanone, and hydrocarbon alcohols selected from the groups consisting of 1-butanol, 2,3-dimethyl-2-butanol, 1-pentanol, 4-methyl-2-pentanol, 2-ethyl hexanol, ethylene glycol, 1,2-butanediol, 1,3-butanediol, 1,4-butanediol, 1,2-propanediol, 1,3-propanediol, and other hydrocarbon alcohols having 4 to 8 carbons.

5. The planarizing composition of claim 1, wherein the polyhedral oligomeric silsesquioxane is formula (II):

(II)

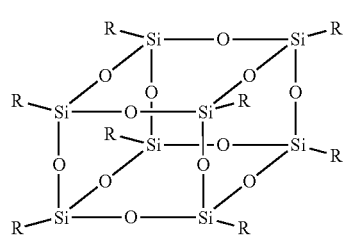

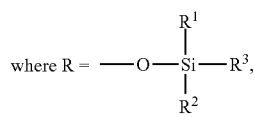

wherein formula (II) is denoted by the formula $Q_8M_8^{R1,R2,R3}$ where Q represents $SiO_{4/2}$ and $M^{R1,R2,R3}$ represents $R^1, R^2, R^3SiO_{1/2}$.

6. The planarizing composition of claim 1, wherein the polyhedral oligomeric silsesquioxane is formula (IV):

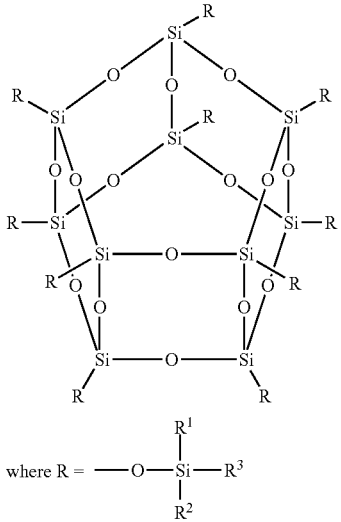

(IV)

where R = $-O-\underset{\underset{R^2}{|}}{\overset{\overset{R^1}{|}}{Si}}-R^3$ wherein formula (IV) is denoted by the formula $Q_{10}M_{10}^{R1,R2,R3}$ where Q represents $SiO_{4/2}$ and $M^{R1,R2,R3}$ represents $R^1, R^2, R^3SiO_{1/2}$.

7. The planarizing composition of claim 1, wherein the polyhedral oligomeric silsesquioxane is formula (VI):

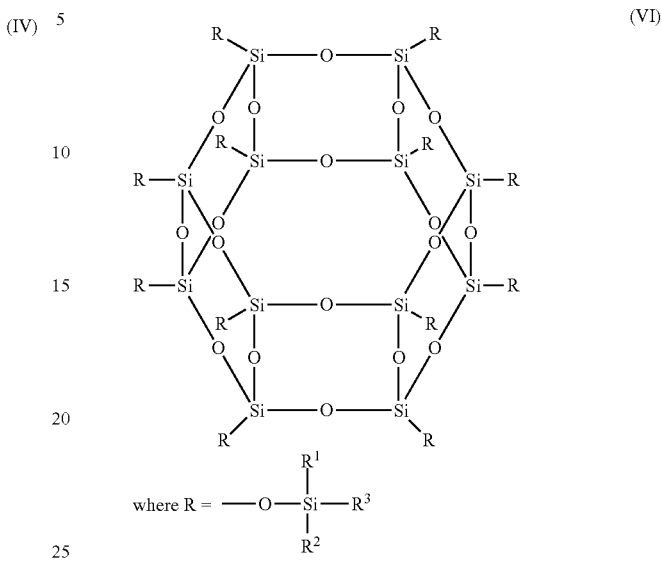

(VI)

where R = $-O-\underset{\underset{R^2}{|}}{\overset{\overset{R^1}{|}}{Si}}-R^3$ wherein formula (VI) is denoted by the formula $Q_{12}M_{12}^{R1,R2,R3}$ where Q represents $SiO_{4/2}$ and $M^{R1,R2,R3}$ represents $R^1, R^2, R^3SiO_{1/2}$.

* * * * *